United States Patent
Theeuwes et al.

(10) Patent No.: US 10,845,713 B2
(45) Date of Patent: Nov. 24, 2020

(54) METROLOGY METHOD AND APPARATUS, COMPUTER PROGRAM AND LITHOGRAPHIC SYSTEM

(71) Applicant: ASML NETHERLANDS B.V., Veldhoven (NL)

(72) Inventors: Thomas Theeuwes, Veldhoven (NL); Hugo Augustinus Joseph Cramer, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/318,999

(22) PCT Filed: Jul. 11, 2017

(86) PCT No.: PCT/EP2017/067393
§ 371 (c)(1),
(2) Date: Jan. 18, 2019

(87) PCT Pub. No.: WO2018/024446
PCT Pub. Date: Feb. 8, 2018

(65) Prior Publication Data
US 2019/0163075 A1    May 30, 2019

(30) Foreign Application Priority Data
Aug. 1, 2016  (EP) .................................. 16182166

(51) Int. Cl.
*G03F 7/00* (2006.01)
*G03F 7/20* (2006.01)
*G01N 21/956* (2006.01)

(52) U.S. Cl.
CPC ....... *G03F 7/70625* (2013.01); *G01N 21/956* (2013.01); *G01N 21/95607* (2013.01);
(Continued)

(58) Field of Classification Search
CPC .......................... G01N 21/956; G03F 7/70508
See application file for complete search history.

(56) References Cited

U.S. PATENT DOCUMENTS

| | | | |
|---|---|---|---|
| 2003/0048458 A1 | 3/2003 | Mieher et al. | |
| 2007/0096304 A1* | 5/2007 | Kabir | C23C 16/04 |
| | | | 257/734 |

(Continued)

FOREIGN PATENT DOCUMENTS

| | | |
|---|---|---|
| TW | 201621266 | 6/2016 |
| WO | 2010007010 | 1/2010 |

(Continued)

OTHER PUBLICATIONS

International Search Report and Written Opinion issued in corresponding PCT Patent Application No. PCT/EP2017/067393, dated Sep. 10, 2017.

(Continued)

*Primary Examiner* — Caridad Everhart
*Assistant Examiner* — Ankush K Singal
(74) *Attorney, Agent, or Firm* — Pillsbury Winthrop Saw Pittman LLP

(57) ABSTRACT

A method of reconstructing a characteristic of a structure formed on a substrate by a lithographic process, and an associated metrology apparatus. The method includes combining measured values of a first parameter associated with the lithographic process to obtain an estimated value of the first parameter; and reconstructing at least a second parameter associated with the characteristic of the structure using the estimated value of the first parameter and a measurement of the structure. The combining may involve modeling a variation of the first parameter to obtain a parameter model or fingerprint of the first parameter.

20 Claims, 7 Drawing Sheets

(52) U.S. Cl.
CPC ...... *G03F 7/70508* (2013.01); *G03F 7/70633* (2013.01); *G01N 2021/95676* (2013.01)

(56) References Cited

U.S. PATENT DOCUMENTS

| | | |
|---|---|---|
| 2008/0069430 A1 | 3/2008 | Setija et al. |
| 2008/0088832 A1 | 4/2008 | Cramer et al. |
| 2009/0094005 A1 | 4/2009 | Den Boef et al. |
| 2013/0050668 A1 | 2/2013 | Kisteman et al. |
| 2016/0154319 A1 | 6/2016 | Mossavat et al. |

FOREIGN PATENT DOCUMENTS

| | | | |
|---|---|---|---|
| WO | WO-2010007010 A1 * | 1/2010 | ............. G01N 21/55 |
| WO | 2015082158 | 6/2015 | |

OTHER PUBLICATIONS

Taiwanese Office Action issued in corresponding Taiwanese Patent Application No. 106125005, dated May 9, 2018.

Bozdog, Cornel et al.: "A holistic metrology approach: multi-channel scatterometry for complex applications", Proc. of SPIE, vol. 7971, Mar. 17, 2011.

Vaid, Alok et al.: "A holistic metrology approach: hybrid metrology utilizing scatterometry, CD-AFM, and CD-SEM", Proc. of SPIE, vol. 7971, 2011.

Henn, Mark-Alexander, et al.: "Optimizing Hybrid Metrology: Rigorous Implementation of Bayesian and Combined Regression", Proc. of SPIE, vol. 9424, Mar. 19, 2015.

Korean Office Action issued in corresponding Korean Patent Application No. 10-2019-7005989, dated Aug. 12, 2020.

* cited by examiner

METROLOGY METHOD AND APPARATUS, COMPUTER PROGRAM AND LITHOGRAPHIC SYSTEM

CROSS-REFERENCE TO RELATED APPLICATIONS

This application is the U.S. national phase entry of PCT patent application no. PCT/EP2017/067393, which was filed on Jul. 11, 2017, which claims the benefit of priority of European patent application no. 16182166.5, which was filed on Aug. 1, 2016, and which is incorporated herein in its entirety by reference.

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

A form of reconstruction may use prior knowledge on the statistical and/or spatial distribution of one or more parameters previously measured (for example, relating to a previous layer) in the reconstruction of a parameter of interest. This can reduce the number of parameters which need to be resolved during the reconstruction, i.e., when there is correlation between the parameter of interest and the previously measured parameter. However, measurements of the previously measured parameter may not always be associated with the same measurement grid as measurements of the parameter of interest. By way of specific example, a profile reconstruction of a parameter of interest, for example CD, may use previously measured overlay data; however the CD targets measured may be at different locations on a substrate than the overlay targets measured.

It would be desirable to improve on such reconstruction methods.

SUMMARY OF THE INVENTION

The invention in a first aspect provides a method of reconstructing a characteristic of a structure formed on a substrate by a lithographic process comprising: a) combining measured values of a first parameter associated with the lithographic process to obtain an estimated value of the first parameter; and b) reconstructing at least a second parameter associated with the characteristic of the structure using the estimated value of the first parameter and a measurement of the structure.

The invention in a second aspect provides a metrology apparatus comprising: an illumination system configured to illuminate with radiation at least a structure produced using a lithographic process on a substrate; a detection system configured to detect scattered radiation arising from illumination of the structure; and a processor operable to: combine measured values of a first parameter associated with a lithographic process to obtain an estimated value of the first parameter; and reconstruct at least a second parameter associated with a characteristic of the structure using the estimated value of the first parameter and the detected scattered radiation.

The invention further provides a computer program comprising processor readable instructions which, when run on suitable processor controlled apparatus, cause the processor controlled apparatus to perform the method of the first aspect, and a computer program carrier comprising such a computer program. The processor controlled apparatus may comprise the metrology apparatus of the second aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
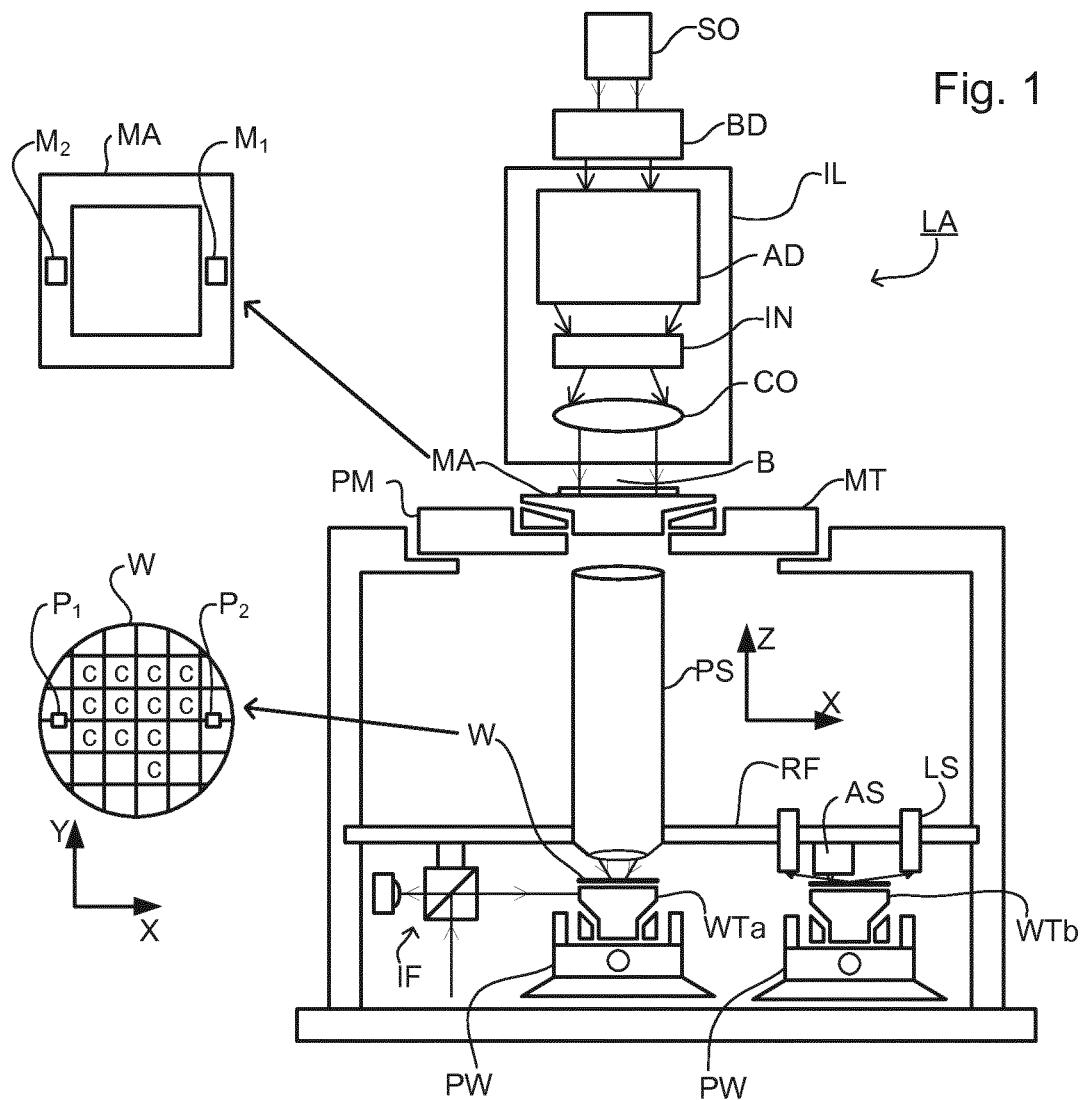
FIG. 1 depicts a lithographic apparatus according to an embodiment of the invention.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
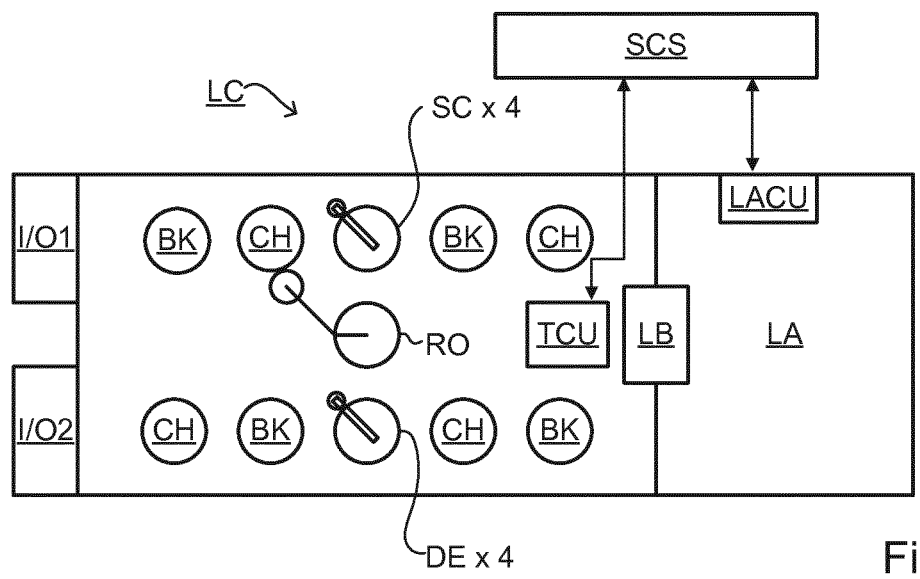
FIG. 2 depicts a lithographic cell or cluster according to an embodiment of the invention.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Figure 3:
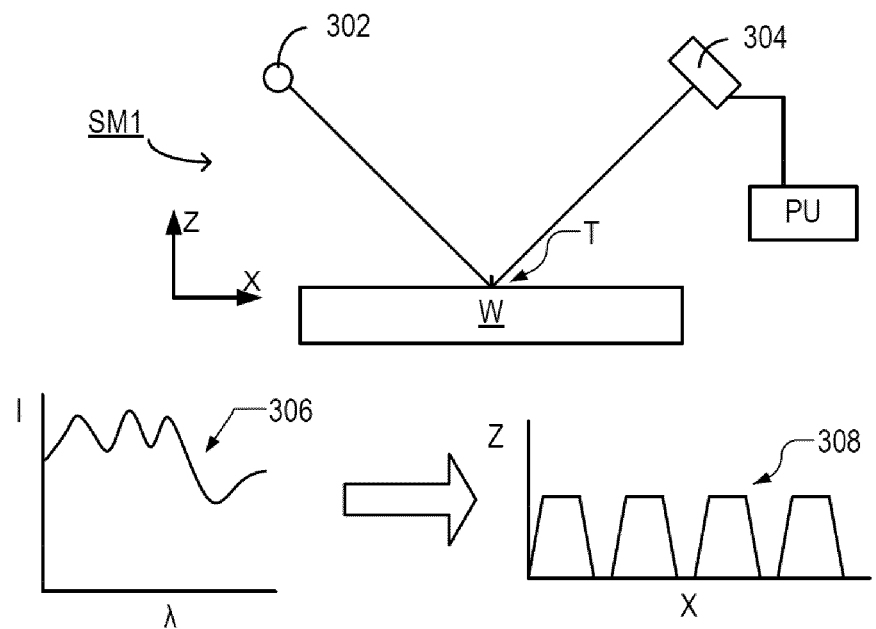
FIG. 3 depicts a first type of scatterometer that may be used in metrology methods according to embodiments of the invention.

FIG. 3 depicts a known spectroscopic scatterometer which may be used as a metrology apparatus in a system of the type described above. It comprises a broadband (white light) radiation projector 302 which projects radiation onto a substrate W. The reflected radiation is passed to a spectrometer 304, which measures a spectrum 306 (intensity as a function of wavelength) of the specular reflected radiation. From this data, the structure or profile 308 giving rise to the detected spectrum may be reconstructed by calculation within processing unit PU. The reconstruction can be performed for example by Rigorous Coupled Wave Analysis and non-linear regression, or comparison with a library of pre-measured spectra or pre-computed simulated spectra. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
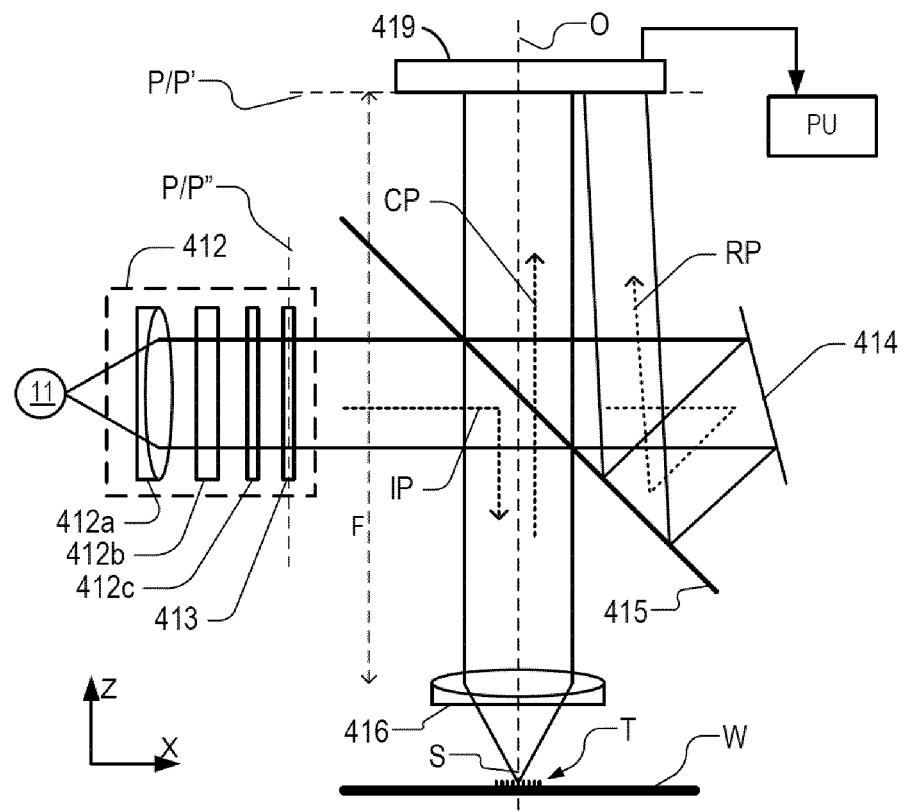
FIG. 4 depicts a second type of scatterometer that may be used in metrology methods according to embodiments of the invention.

FIG. 4 shows the basic elements of a known angle-resolved scatterometer that may be used instead of or in addition to a spectroscopic scatterometer. In this type of inspection apparatus, radiation emitted by a radiation source 411 is conditioned by an illumination system 412. For example, illumination system 412 may include a collimating using lens system 412a, a color filter 412b, a polarizer 412c and an aperture device 413. The conditioned radiation follows an illumination path IP, in which it is reflected by partially reflecting surface 415 and focused into a spot S on substrate W via a microscope objective lens 416. A metrology target structure T may be formed on substrate W. Lens 416, has a high numerical aperture (NA), preferably at least 0.9 and more preferably at least 0.95 Immersion fluid can be used to obtain with numerical apertures over 1 if desired.

As in the lithographic apparatus LA, one or more substrate tables may be provided to hold the substrate W during measurement operations. The substrate tables may be similar or identical in form to the substrate tables WTa, WTb of FIG. 1. (In an example where the inspection apparatus is integrated with the lithographic apparatus, they may even be the same substrate tables.) Coarse and fine positioners may be configured to accurately position the substrate in relation to a measurement optical system. Various sensors and actuators are provided for example to acquire the position of a target of interest, and to bring it into position under the objective lens 16. Typically many measurements will be made on targets at different locations across substrate W. The substrate support can be moved in X and Y directions to acquire different targets, and in the Z direction to obtain a desired focusing of the optical system on the target. It is convenient to think and describe operations as if the objective lens and optical system are being brought to different locations on the substrate, when in practice the optical system remains substantially stationary and only the substrate moves. In other examples, the substrate moves in one direction while the optical system moves in the other direction, to achieve overall X-Y movement. Provided the relative position of the substrate and the optical system is correct, it does not matter in principle whether one or both of those is moving in the real world.

When the radiation beam is incident on the beam splitter 416 part of it is transmitted through the beam splitter (partially reflecting surface 415) and follows a reference path RP towards a reference mirror 414.

Radiation reflected by the substrate, including radiation diffracted by any metrology target T, is collected by lens 416 and follows a collection path CP in which it passes through partially reflecting surface 415 into a detector 419. The detector may be located in the back-projected pupil plane P, which is at the focal length F of the lens 416. In practice, the pupil plane itself may be inaccessible, and may instead be re-imaged with auxiliary optics (not shown) onto the detector located in a so-called conjugate pupil plane P'. The detector may be a two-dimensional detector so that a two-dimensional angular scatter spectrum or diffraction spectrum of a target structure can be measured. In the pupil plane or conjugate pupil plane, the radial position of radiation defines the angle of incidence/departure of the radiation in the plane of focused spot S, and the angular position around an optical axis O defines azimuth angle of the radiation. The detector 419 may be, for example, an array of CCD or CMOS sensors, and may use an integration time of, for example, 40 milliseconds per frame.

Radiation in reference path RP is projected onto a different part of the same detector 419 or alternatively on to a different detector (not shown). A reference beam is often used for example to measure the intensity of the incident radiation, to allow normalization of the intensity values measured in the scatter spectrum.

It may be noticed that radiation is reflected by and later transmitted through partially reflecting surface 415 on its way from source 411 to detector 419. At each reflection or transmission, a substantial portion of the radiation is "lost" and cannot be used in the measurement. A portion of the lost radiation may be used for other purposes, for example to serve for focusing or alignment; or for the reference beam as described above.

The various components of illumination system 412 can be adjustable to implement different metrology 'recipes' within the same apparatus. Color filter 412b may be implemented for example by a set of interference filters to select different wavelengths of interest in the range of, say, 405-790 nm or even lower, such as 200-300 nm. An interference filter may be tunable rather than comprising a set of different filters. A grating could be used instead of interference filters. Polarizer 412c may be rotatable or swappable so as to implement different polarization states in the radiation spot S. Aperture device 413 can be adjusted to implement different illumination profiles. Aperture device 413 is located in a plane P" conjugate with pupil plane P of objective lens 416 and the plane of the detector 419. In this way, an illumination profile defined by the aperture device defines the angular distribution of light incident on substrate radiation passing through different locations on aperture device 413.

The detector 419 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic-polarized light and transverse electric-polarized light. For finer resolution, EUV wavelengths can be considered for use in metrology apparatus, with appropriate modification of the source and optical system.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PS. Illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes. The techniques disclosed herein are not limited to inspection of grating structures, and any target structure, including a blank substrate or a substrate having only flat layers on it, is included within the term "target structure".

The target T in practice may be a structure more complicated than a simple grating. The target structure may be a product structure rather than a target formed specifically for metrology. The target structure may be of more than one layer, such as the double-patterned fin and trench structure of FIG. 2, for example.

Using one of the scatterometers described above in combination with modeling of a target structure such as the target T and its diffraction properties, measurement of the shape and other parameters of the structure can be performed in a number of ways. In a first type of process, represented by FIG. 6, a diffraction pattern based on a first estimate of the target shape (a first candidate structure) is calculated and compared with the observed diffraction pattern. Parameters of the model are then varied systematically and the diffraction re-calculated in a series of iterations, to generate new candidate structures and so arrive at a best fit. While some methods vary the parameters systematically, other techniques rely on sampling the parameter space in a random fashion. Examples of these are Monte-Carlo Markov Chain methods. Those techniques are not excluded from the present disclosure. In a second type of process, spectra for many different candidate structures are calculated in advance to create a 'library' of spectra. Then the spectrum observed from the measurement target is compared with the library of calculated spectra to find a best fit. Both methods can be used together: a coarse fit can be obtained from a library, followed by an iterative process to find a best fit. The methods to be described below relate to the method of simulating interaction between radiation and a structure, and can be applied in any of these types of process. The first type of process will be referred to, only for the sake of illustration.

CD or profile reconstruction using scatterometry tries to resolve parameters of interest (e.g. CD, side-wall angle, layer thickness, refractive index), from reflectivity measurement of a structure on a substrate. The structure may comprise either special designed targets in scribelanes or dummy areas, or directly on repeating structures in the device area.

From the reflectivity measurement data, the structure or profile giving rise to the detected spectrum (or "pupil") may be reconstructed by calculation within processing unit PU. The reconstruction can be performed for example by Rigorous Coupled Wave Analysis and non-linear regression. In general, for the reconstruction the general form of the structure is known and some parameters are assumed from knowledge of the process by which the structure was made, leaving only a few parameters of the structure to be determined from the scatterometry data. Simply stated, the reconstruction process may comprise simulating the spectrum or pupil response of a modelled structure and comparing this to the actual measured spectrum. Assuming that the simulated and measured spectra are not a perfect match, the values of one or more parameters of the model will be altered and the spectrum response re-simulated. This is repeated until the mismatch between the simulated and measured spectra is minimized.

CD or profile reconstruction requires that the nominal stack geometry and optical material are well known and relies on the fact that small deviations from nominal can be reconstructed in the fitting process. In this process, measurement data are fitted by the simulations which are based on numerically solving the reflection equations of electromagnetic waves (Maxwell equations) as a function of parameter deviations, combined with (known/modelled) properties of the measurement sensor.

The modelled parameter values (e.g., geometry and/or optical material parameters) which result in the closest match between the simulated spectrum and the measured spectrum is considered to contain the actual values of the parameters of interest (e.g., CD, SWA) and, in addition, 'nuisance' parameters that are necessary in the fitting process but are of no value for the customer.

The number of parameters which describe the variations in stack geometries and optical properties over a substrate, or in time (substrate to substrate), on complex stacks will be large. Such a large set of fitting parameters typically cannot be uniquely resolved from a single reflection measurement, i.e. various configurations of parameter variations can result in the same simulated spectrum response and hence the same fit quality.

One way to overcome this shortcoming is 'Holistic Metrology'. This comprises using prior measurement knowledge of one or more parameters to reduce the burden in determining the configuration of parameter variations which could be responsible for the measured reflection spectrum. A more generic way is to use prior knowledge of the probability distribution of one or more parameters, also known as a Bayesian approach.

Figure 5:
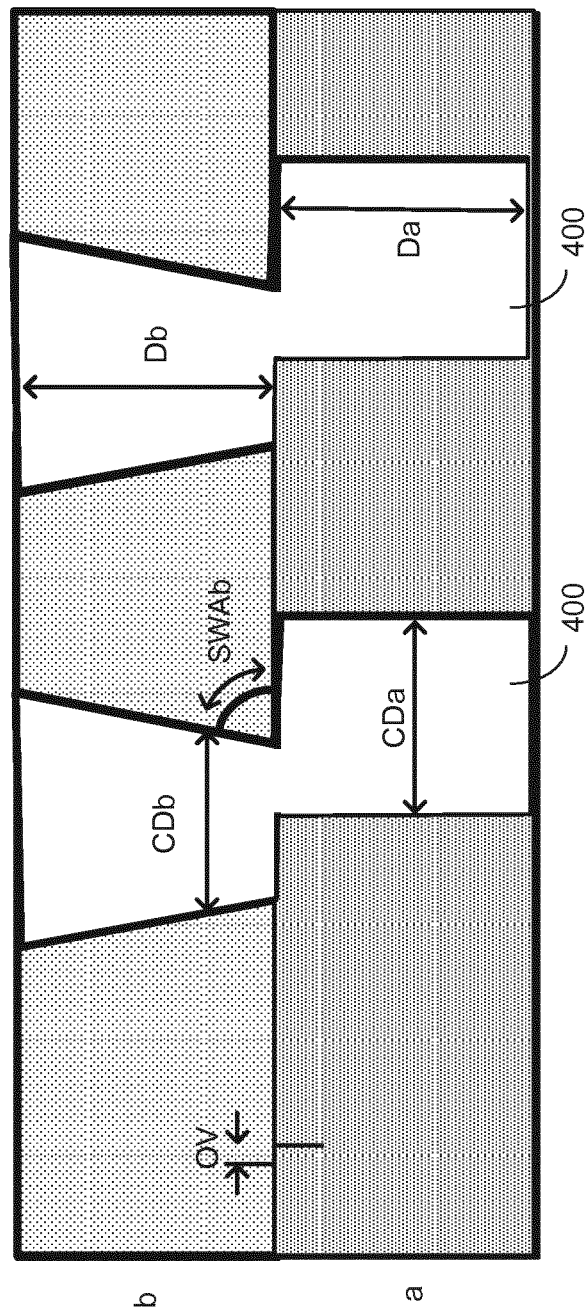
FIG. 5 comprises a schematic diagram of two layers of a structure in cross-section, with relevant parameters labelled.

FIG. 5 illustrates the principle of holistic metrology. Shown is a repeated structure 400 formed in two layers, layer a and layer b. When reconstructing the structure 400, the modelled parameters may comprise critical dimensions CDa, CDb, depths Db, Da, side wall angle SWAb and overlay OV between layers b and a. One (or more) of these will be the parameter of interest, while the remainder will be nuisance parameters. In conventional reconstruction metrology, all 6 of these parameters require simultaneous fitting. However, in holistic metrology, the parameters relating to layer a (i.e., CDa, Da) can be determined first in an initial reconstruction step performed using measurements of layer a performed before layer b is formed. This means that only the remaining 4 parameters (i.e., CDb, Db, SWAb, OV) will require fitting during reconstruction of structure 400; the values already determined for parameters CDa, Da are assumed to remain constant and therefore fed forward as fixed parameters. In fact, overlay OV could be measured using another scatterometry technique (e.g., via measurement of target asymmetry of overlay targets) in a separate measurement step, this overlay value can then be used as a fixed value in the reconstruction, meaning that only three parameters require fitting in the final reconstruction of structure 400.

Figure 6:
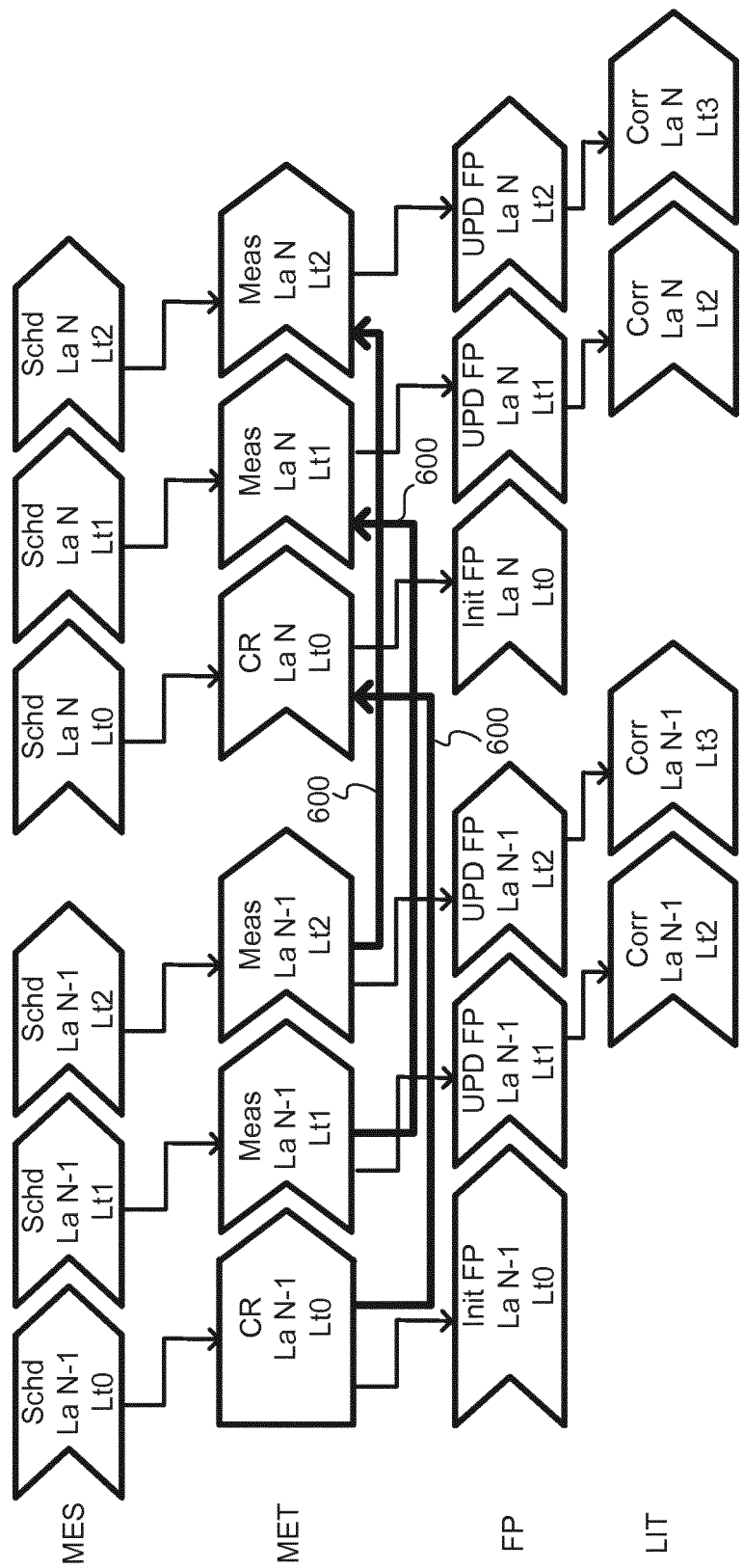
FIG. 6 comprises a flow diagram of a lithographic and metrology method.

FIG. 6 is a process flow diagram illustrating this holistic metrology approach within a complete manufacturing process. The top process flow MES are steps performed by a manufacturing execution system (MES) of a lithographic process. The MES controls the instruction which starts a metrology measurement on a metrology apparatus and retrieves the relevant metrology result documents after measurement is completed. Other control schemes are possible and can be envisaged, for example the metrology apparatus may perform its own control without a MES. The next process flow MET are the steps performed by a metrology or inspection tool such as that illustrated in FIG. 3. In each case, La refers to the Layer and Lt the lot.

The process begins, for a first layer La N−1, by performing a scheduling step Schd of a first lot (Lt0) by the MES. The scheduling step may comprise determining instructions describing, for example, the materials, equipment and/or recipes which are to be used to execute a desired measurement step.

Based on the scheduled instructions, a "recipe" may be created, step CR, on which measurements of the layer on subsequent lots will be based. The recipe may determine how the measured data should be "automatically" interpreted subsequent to being measured.

The metrology apparatus MET is then used in measurement steps Meas to measure the same layer La N−1 of subsequent lots based on the scheduling instructions from the MES. Each measurement step by the metrology apparatus MET may comprise a reconstruction. A similar process is performed for the next layer La N (and any subsequent layers). However, as indicated by the bold arrows 600, each measurement step Meas (and the initial create recipe step CR) of layer La N, performed using metrology apparatus MET may use parameter values determined from corresponding lot measurements of the previous layer La N−1 (or any previous layer) in its reconstruction. In this way, the number of parameters which need to be fitted in the measurement step of layer La N can be reduced.

There are a number of issues with known holistic metrology approaches. For the direct holistic approach, in order to allow a 1:1 coupling of the parameters, the previous layers must be measured with the same sampling scheme as the final layer and on the same substrate. This is not always feasible, and if feasible, does not allow proper sampling optimization. Alternatively, the Bayesian approach allows different sampling schemes per layer, but local information is lost in an overall probability distribution of the holistic parameters.

It should be appreciated that different parameters may show very different characteristic fingerprints across the substrate and different sampling schemes may be used to properly capture this behavior. At the same time, where possible, the number of measurements should ideally be kept to the minimum required to capture a particular behavior or fingerprint to reduce measurement time and therefore increase throughput.

By way of specific examples, some parameters will only display low-order variation and therefore a relatively sparse sampling may be sufficient. Other parameters show high-order behavior and more measurements should be made to capture this high order behavior. Some parameters may show no intrafield behavior. For example, parameters relating to a global deposition process which does not discriminate "exposure" fields, such as the height of a sub-layer, may require only one measurement per field (or an even sparser scheme). By way of contrast, some parameters describe mostly (or exclusively) intrafield behavior, e.g., relating to mask writing errors which may create intrafield related profile variations. In this case a sampling scheme which samples from only one or a few fields may be necessary to capture this behavior. Other parameters may have characteristic fingerprints which are known to show much greater (or lesser) variation at specific regions. Therefore the sampling scheme should reflect this by performing denser sampling at the regions of greater variation. Such characteristic fingerprints may be across-substrate (e.g., regions at the substrate edge may require more measurements), across-field or a combination of both.

In addition, other context data, such as alignment data or leveling data from the lithographic apparatus/scanner, which may be modelled and used in a holistic process within the scope of the methods described herein, will typically be measured on a different grid (e.g., with reference to the scanner frame) than measurements performed by a metrology apparatus.

FIG. 6 also shows a process flow FP, which are the steps performed by a processor performing a model or fingerprint determination process. Such a processor may form part of the metrology apparatus, the lithographic apparatus or may be part of a separate stand-alone computer. The bottom process flow LIT are the steps performed by a lithographic apparatus (or scanner) during a patterning process when a pattern is applied lithographically. This process flow describes an improved feedback loop which may be used in a lithographic process. Without fingerprint determination, corrections Con are determined for subsequent lots based directly on measurements performed on a substrate of a previous lot by a metrology apparatus MET; the correction being based on a nearest measurement. However, metrology measurements are relatively slow, and consequently, a balance should be maintained between accuracy/quality and throughput. Because of this, the nearest measurement on which a correction is based may be some distance from the location where the correction is applied. The accuracy of the correction may suffer as a result.

The fingerprint determination process improves this by essentially "upscaling" the measurement data. In an embodiment, it does this by determining a distribution model (referred to herein as a fingerprint) of one or more measurement parameters (in an initialize fingerprint step Init FP). The fingerprint may describe the across-substrate, intrafield, interfield, and/or context dependent variation in terms of only a limited number of parameters. As such, this fingerprint can provide an estimated (modelled) value for a parameter for each location where a correction is to be determined, without a measurement necessarily being made at that location. By way of specific example, a fingerprint may take the form of a polynomial fit to measured data, determined by a principal component analysis (PCA) and/or a comparison to historically determined fingerprints. This fingerprint variation can be updated UPD FP every time new measurements Meas are performed on the corresponding layer.

Figure 7:
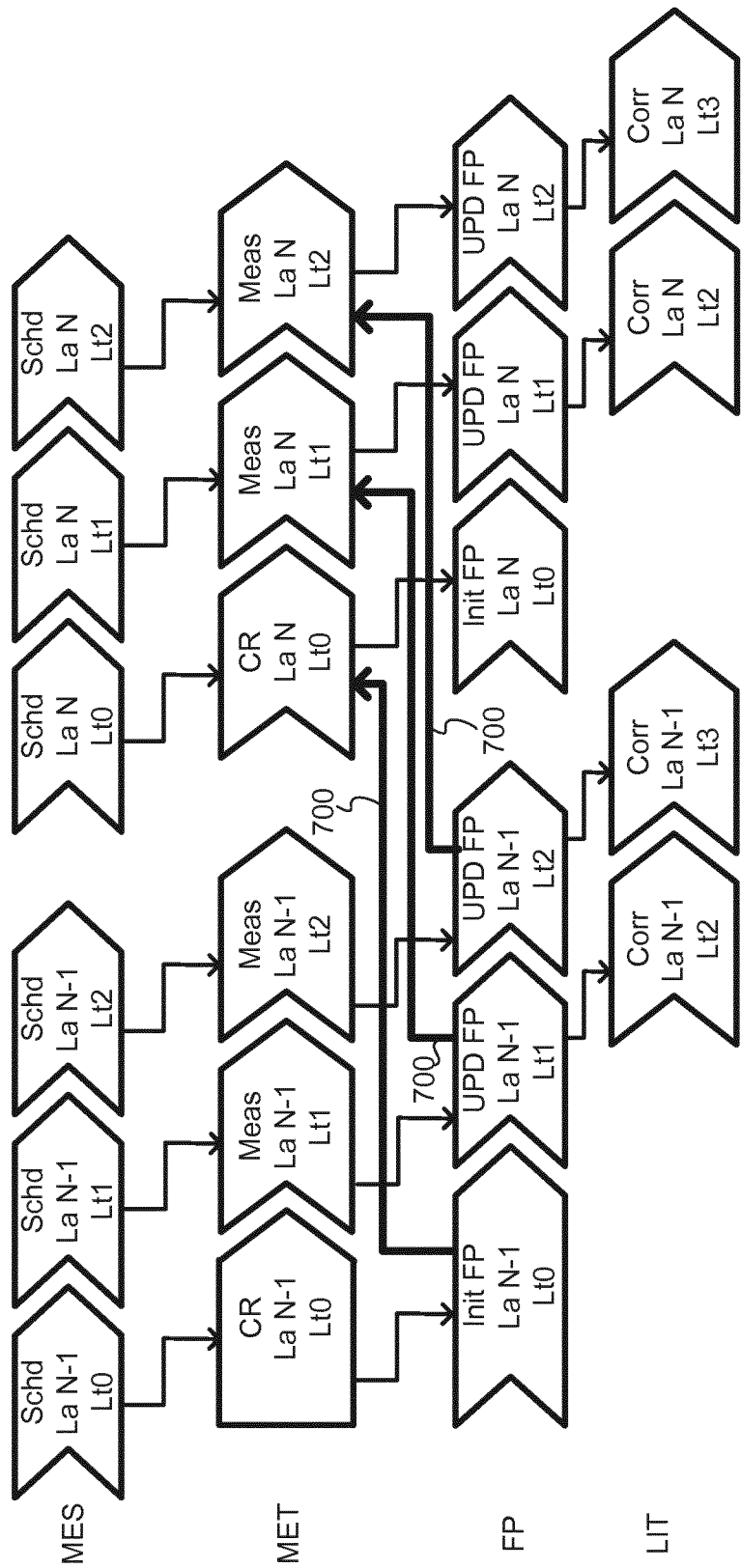
FIG. 7 comprises a flow diagram of a metrology process illustrating a first embodiment of the invention FIG. 8 comprises a flow diagram of a metrology process illustrating a first embodiment of the invention.

FIG. 7 is a process flow diagram describing an improved process flow. It is proposed to determine a parameter model or distribution model (fingerprint) of one or more holistic parameters. The fingerprint may describe the across-substrate, intrafield, interfield, and/or context dependent variation of the one or more holistic parameters. Holistic parameters may be determined to be those which show (e.g., a high degree of) cross-correlation with other parameters (e.g., parameters of interest), and therefore on which such other parameters are dependent. Holistic parameters may be measured using a dedicated metrology apparatus or otherwise (e.g., the lithographic apparatus). Holistic parameters may be, for example, structural parameters describing aspects of a structure, material parameters of e.g., a structure or a layer, a parameter associated with a reflectivity measurement e.g., of a structure and stack or any other parameter which may affect a reflectivity measurement.

The fingerprint variation can be determined from sets of preliminary or training substrates on which product structures have been applied using a lithographic process. This may comprise training the model based upon measured variation from the training substrates. By way of example, Bayesian Reconstruction requires knowledge on the statistical distribution of priors which may be initially obtained from the training wafers. In the specific example illustrated, the training substrates are comprised in lot Lt0 in the flow of FIG. 7. Once the model has been initialized, sampling schemes for measurements of the modelled layer La N−1 (and/or one or more previous layers) can be optimized.

As more measurements are made, the parameters of the fingerprint model can be updated UPD FP. The updates may be derived from measurements using datasets from similar substrates (e.g., substrates comprising the same structures/pattern/product), but:
  measured at a previous process and or inspection step.
  measured on the same substrate using a different target.
  measured on the same substrate using same target.
  all the above using a different metrology apparatus/method (e.g. scanning electron microscope, atomic force microscopy, diffraction based overlay/focus).

The "training" set and datasets of the same substrate can each comprise a different production lot in a run-to-run control process. The fingerprint estimate and uncertainty (i.e., variance) can be dynamically updated, stored and retrieved based on production context (e.g., a different fingerprint for each process: for example fingerprints per deposition, etch chamber or inspection step). As such, the fingerprint model may be a (e.g., exponentially weighted) moving average based on the substrates of previous lots. The more lot-to-lot statistical information on the fingerprint variance which is available, the better the "priors" which can be estimated for the Bayesian reconstruction of parameter(s) of interest.

In FIG. 7, measurements of layer La N−1, lot Lt0 are scheduled by the MES and a recipe is created CR by the metrology apparatus MET. Based on the created recipe, the fingerprint model is initialized by the fingerprint determination process FP for each holistic parameter. For example, where the fingerprint is an interfield substrate fingerprint, this step may comprise using an e.g., Zernike model to fit the measurements in order to obtain the fingerprint.

The fingerprint determination process FP may have the functionality to determine the optimal model to describe the fingerprint, including context information, and to determine optimal sampling schemes. By way of specific example, a training set of wafers may be measured with a dense sampling scheme. Using these measurements, both substrate-to-substrate variance and lot-to-lot variance is determined statistically. A suitable sampling scheme can then be based on the determined variances; for example locations can be classified as having high variance or low variance and a sampling scheme then determined which samples the high variance locations more densely than the areas that are relatively stable.

Once initialized, the fingerprint can then be used in a feed-forward process (illustrated by bold arrows 700) to provide estimated values for holistic parameters in corresponding measurement (and therefore reconstruction) steps of subsequent layers (e.g., layer La N), in a holistic metrology process. The estimated value can be location specific, intrafield, interfield and/or context specific.

In an embodiment, the fingerprint can also be used in reconstructing another parameter associated with the same layer. For example, where a layer comprises overlay targets and CD targets at different locations across the substrate, determination of an overlay fingerprint can be used to improve profile reconstruction. This may be a feedback process within the same lot, or feed forward process to subsequent lots.

While the fingerprint is described as being determined from measurements performed by a dedicated metrology apparatus MET, it may instead be determined from parameters measured by the lithographic apparatus, or any other apparatus; for example, levelling data (e.g., measured using a level sensor and/or air gauge) or alignment data (e.g., measured using an alignment sensor). The measurement may be performed using any metrology method or device, including, for example: reconstruction, asymmetry measurements, scanning electron microscope measurements, e-beam metrology measurements. As such, different tools may be used to measure the holistic parameter(s) (first parameter) and the parameter of interest (second parameter).

The fingerprint (for each layer/context etc.) can be updated every time a new measurement is made, improving its robustness. Other statistical information can also be logged as the number of measurements increase, for example, lot-to-lot fingerprint variation. This can be used to provide an estimate of noise and therefore the model uncertainty. This information can also be used in the measuring/reconstruction steps Meas, for example, by giving more weight to parameters which are modelled with less uncertainty.

Figure 8:
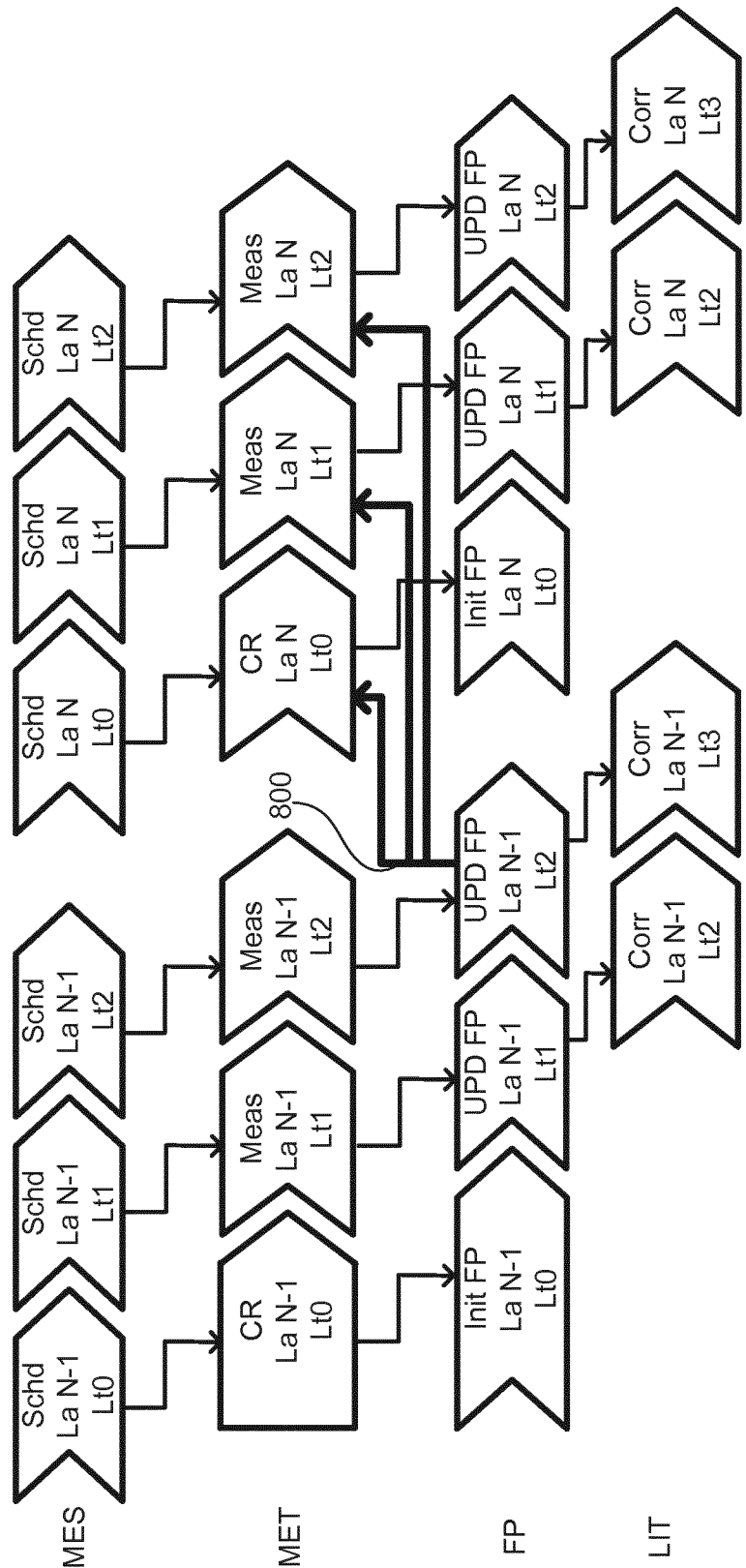

In the embodiment illustrated by FIG. 7, measurement steps performed by the metrology apparatus MET (e.g., of layer La N) use the fingerprint of one or more previous layers (e.g., of layer La N−1) relating to that lot. The system may use the Lot ID to ensure that the corresponding fingerprint is always retrieved. However, instead of lot specific fingerprints being determined, a lot independent fingerprint can be maintained and updated each time a new measurement is made. The latest fingerprint can then always be retrieved when measuring subsequent layers, regardless of the lot number. This latter embodiment is illustrated in FIG. 8, where the holistic parameter feed forward is indicated by arrow 800.

As previously mentioned, the methods described herein allow for sampling optimization (on a per layer basis). This is because the fingerprint used to provide estimates of values for holistic parameters in previous layers is independent of the sampling scheme used. Where a holistic parameter may comprise little variation (for example layer thickness of a particular layer), only a relatively sparse sampling scheme may be required to capture the fingerprint, while parameters of more complicated structures may require denser sampling.

Figure 9:
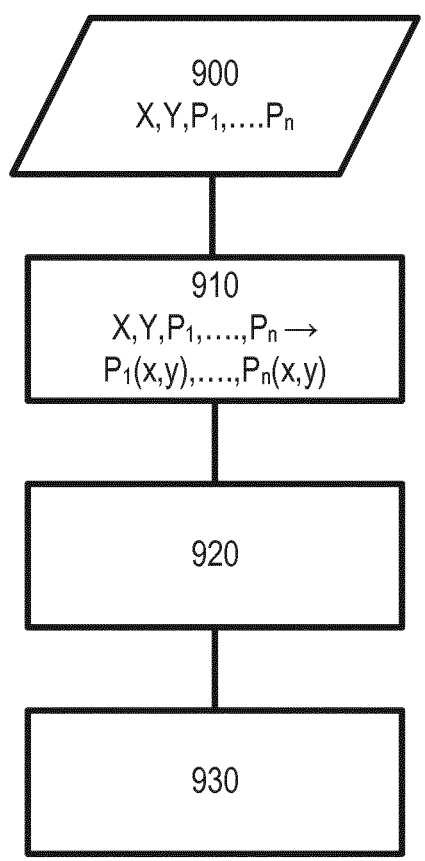
FIG. 9 comprises a flow diagram describing a metrology process according to a further embodiment of the invention.

FIG. 9 is a flowchart of a metrology method. Note that the method can be used in any fitting based reconstruction method, for example, to determine a profile, CD, focus or overlay parameter.

External data 900, comprising positional information (X,Y) and parameter values ($P_1, \ldots P_n$) at a number of measurement points n is used to estimate a fingerprint (parameter model) 910 ($P_1(x,y), \ldots, P_n(x,y)$) describing variation of a first parameter, for example across substrate (and/or interfield, intrafield, context dependent variation). This first parameter may be any of: overlay, CD, edge placement error (EPE), focus, sidewall angle (SWA), stack properties (reflectance, thickness of layers), but any other parameter relevant for reconstruction of a second parameter may be used. This fingerprint is used to provide an estimate value $P_t(x,y)$ for the parameter at a relevant location t, which is used when reconstructing 920 an (e.g., dependent) second parameter value in the same or a subsequent layer. The second parameter may be the parameter of interest (for example focus, overlay, CD, profile). This parameter of interest may then be reported 930, and used to monitor a lithographic process, for example. This may comprise determining process corrections based on the reported value for the parameter of interest.

While the above description comprises determining a parameter model or fingerprint in order to determine an estimated value for the first parameter, alternative methods of determining an estimated value for the first parameter are also envisaged with the scope of this disclosure. For example, the first parameter value can be estimated from an interpolation (e.g., a weighted average) of measured values of the first parameter.

It should be appreciated that the term "lithographic process" should not be assumed to refer only to the photolithography process step, but also other processes which form part of an overall semiconductor manufacturing process. Such processes may include etch processes to form a final device profile or processes to form a hardmask. The metrology steps described may be performed after any such lithographic process.

Use of the words first and second in, for example "first layer", "second layer", "first parameter", "second parameter" are used purely to differentiate the structures or layers and are not used in the absolute sense. For example, the "first layer" is not necessarily the very first layer (bottommost layer), but could be any layer below the second layer.

Measurement may be of metrology targets specifically designed and formed for the purposes of measurement. In other embodiments, properties may be measured on targets which are functional parts of devices formed on the substrate. Many devices have regular, grating-like structures. The terms 'target grating' and 'target' as used herein do not require that the structure has been provided specifically for the measurement being performed. Further, pitch P of the metrology targets is close to the resolution limit of the optical system of the scatterometer, but may be much larger than the dimension of typical product features made by lithographic process in the target portions C. In practice the lines and/or spaces of the overlay gratings within the targets may be made to include smaller structures similar in dimension to the product features.

In association with the physical grating structures of the targets as realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within unit PU in the apparatus of FIG. 3 or 4 and/or the control unit LACU of FIG. 2. There may also be provided a data storage medium (e.g., semiconductor memory, magnetic or optical disk) having such a computer program stored therein.

Further embodiments of the invention are disclosed in the numbered clauses below:

1. A method of reconstructing a characteristic of a structure formed on a substrate by a lithographic process comprising: a) combining measured values of a first parameter associated with the lithographic process to obtain an estimated value of the first parameter; and b) reconstructing at least a second parameter associated with the characteristic of the structure using the estimated value of the first parameter and a measurement of the structure.

2. A method according to clause 1, wherein: step a) comprises modeling a variation of the first parameter to obtain a parameter model; and step b) comprises using the parameter model to estimate the value for the first parameter.

3. A method according to clause 2, wherein the parameter model describes the variation of at least the first parameter as a function of location on the substrate surface.

4. A method according to clause 2 or 3, wherein the parameter model describes the interfield and/or intrafield variation of at least the first parameter.

5. A method according to any of clauses 2, 3 or 4, wherein step a) comprises modeling the variation separately for different production contexts, to obtain parameter models per production context.

6. A method according to any of clauses 2 to 5, wherein said parameter model is updated using subsequent measurements of the same substrate and/or subsequent substrates of a same production run.

7. A method according to clause 6 wherein the estimated value of the first parameter used to reconstruct the second parameter for a particular lot is determined from an update of the parameter model which was last updated using measurements of the same lot.

8. A method according to clause 6 wherein the estimated value of the first parameter used to reconstruct the second parameter for each lot is determined from the final update of the parameter model of a production run.

9. A method according to any of clauses 2 to 8 wherein said modeling of a variation of the first parameter to obtain a parameter model is performed using measurements taken from a preliminary set of production substrates, in a preliminary step.

10. A method according to clause 1 wherein step a) comprises interpolating the estimated value from measured values of the first parameter.

11. A method according to clause 10 wherein the interpolation uses a weighted average of the measured values of the first parameter to obtain the estimated value.

12. A method according to any preceding clause wherein the estimated value at step a) is an estimate of the value of the first parameter at a location on the substrate corresponding to the location of said measurement of the structure.

13. A method according to any preceding clause wherein the first parameter and second parameter are associated with the same layer of the lithographic process.

14. A method according to any of clauses 1 to 12 wherein the first parameter is associated with a first layer formed during the lithographic process and the second parameter is associated with a second layer formed during the lithographic process, the second layer being formed subsequent to said first layer.

15. A method according to clause 14, comprising the step of optimizing a sampling scheme which determines one or more measurement location(s) on said substrate during subsequent measurement of said first layer and/or on said second layer.

16. A method according to clause 15, wherein the sampling scheme for the first layer and second layer is different.

17. A method according to any of clauses 1 to 16, comprising the step of optimizing a sampling scheme which determines the location(s) on said substrate that subsequent measurements of said first parameter will be made.

18. A method according to clause 17, wherein the sampling scheme is optimized according to a determined variance of said first parameter.

19. A method according to any preceding clause, comprising determining variance in measured values for each measurement and determining an uncertainty value for the estimated value of the first parameter from the determined variance.

20. A method according to any preceding clause, wherein the at least one second parameter comprises one or more of: critical dimension, focus, a profile dimension, side wall angle or angle of any structure feature, overlay.

21. A method according to any preceding clause, wherein said reconstruction comprises a fitting based reconstruction process wherein a simulated diffraction response is compared to a measured diffraction response and the value of at least said second parameter is varied to minimize the mismatch between the simulated diffraction response and the measured diffraction response.

22. A method according to clause 21, wherein the second parameter is correlated with the first parameter, and the first parameter is assumed to have said estimated value during the fitting based reconstruction process.

23. A metrology apparatus operable to perform the method of any of clauses 1 to 22.

24. A metrology apparatus comprising:
an illumination system configured to illuminate with radiation at least a structure produced using a lithographic process on a substrate;
a detection system configured to detect scattered radiation arising from illumination of the structure; and
a processor operable to:
combine measured values of a first parameter associated with a lithographic process to obtain an estimated value of the first parameter; and
reconstruct at least a second parameter associated with a characteristic of the structure using the estimated value of the first parameter and the detected scattered radiation.

25. A metrology apparatus according to clause 24, wherein the processor is operable to model a variation of the first parameter to obtain a parameter model; and use the parameter model to estimate the value for the first parameter.

26. A metrology apparatus according to clause 25, wherein the parameter model describes the variation of at least the first parameter as a function of location on the substrate surface.

27. A metrology apparatus according to clause 25 or 26, wherein the parameter model describes the interfield and/or intrafield variation of at least the first parameter.

28. A metrology apparatus according to any of clauses 25 to 27, wherein the processor is operable to update said parameter model using subsequent measurements of the same substrate and/or subsequent substrates of a same production run.

29. A metrology apparatus according to any of clauses 24 to 28 operable to determine an estimated value of the first parameter for a location on the substrate corresponding to the location of said measurement of the structure.

30. A metrology apparatus according to any of clauses 24 to 29, operable to optimize a sampling scheme which determines the location(s) on said substrate that subsequent measurements of said first parameter will be made.

31. A metrology apparatus according to clause 30 comprising making subsequent measurements of said first parameter in accordance to said sampling scheme.

32. A metrology apparatus according to clause 30 or 31, operable to optimize said sampling scheme according to a determined variance of said first parameter.

33. A metrology apparatus according to any of clauses 24 to 32, being operable to determine variance in measured values for each measurement and determining an uncertainty value for the estimated value of the first parameter from the determined variance.

34. A metrology apparatus according to any of clauses 24 to 33, wherein the at least one second parameter comprises one or more of: critical dimension, focus, a profile dimension, side wall angle or angle of any structure feature, overlay.

35. A metrology apparatus according to any of clauses 24 to 34, wherein said reconstruction comprises a fitting based reconstruction process wherein a simulated diffraction response is compared to a measured diffraction response and the value of at least said second parameter is varied to minimize the mismatch between the simulated diffraction response and the measured diffraction response.

36. A metrology apparatus according to clause 35, wherein the second parameter is correlated with the first parameter, and operable to assume that the first parameter has said estimated value during the fitting based reconstruction process.

37. A metrology apparatus according to any of clauses 24 to 34, operable to perform measurements of said first parameter to obtain said measured values of a first parameter.

38. A lithographic cell comprising the metrology apparatus of any of clauses 23 to 37.

39. A computer program comprising processor readable instructions which, when run on suitable processor controlled apparatus, cause the processor controlled apparatus to perform the method of any one of clauses 1 to 22.

40. A computer program carrier comprising the computer program of clause 39.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of reconstructing a characteristic of a structure formed on a substrate by a semiconductor manufacturing process, the method comprising:
    combining measured values of a first parameter associated with the semiconductor manufacturing process to obtain an estimated value of the first parameter, wherein the first parameter is associated with a first layer formed during the semiconductor manufacturing process and comprising using a parameter model to estimate the value for the first parameter, wherein the parameter model describes the variation of at least the first parameter as a function of location on the substrate surface; and
    reconstructing at least a second parameter associated with the characteristic of the structure using the estimated value of the first parameter and a measurement of the structure, wherein the second parameter is associated with a second layer formed during the semiconductor manufacturing process, the second layer being formed subsequent to the first layer.

2. The method as claimed in claim 1, further comprising modeling the variation separately for different production contexts, to obtain parameter models per production context.

3. The method as claimed in claim 1, wherein the parameter model is updated using subsequent measurements of the same substrate and/or one or more subsequent substrates of a same production run.

4. The method as claimed in claim 3, wherein the estimated value of the first parameter used to reconstruct the second parameter for each lot of substrates is determined from the final update of the parameter model of a production run.

5. The method as claimed in claim 1, further comprising optimizing a sampling scheme which determines one or more measurement locations on the substrate during subsequent measurement of the first layer and/or on the second layer.

6. The method as claimed in claim 5, wherein the sampling scheme for the first layer and second layer is different.

7. The method as claimed in claim 1, further comprising determining variance in the measured values and determining an uncertainty value for the estimated value of the first parameter from the determined variance.

8. The method as claimed in claim 1, wherein the first parameter comprises one or more selected from: critical dimension, focus, a profile dimension, side wall angle or angle of any structure feature, or overlay.

9. The method as claimed in claim 1, wherein the second parameter comprises one or more selected from: critical dimension, focus, a profile dimension, side wall angle or angle of any structure feature, or overlay.

10. The method as claimed in claim 1, wherein the reconstruction comprises a fitting based reconstruction process wherein a simulated diffraction response is compared to a measured diffraction response and the value of at least the second parameter is varied to minimize the mismatch between the simulated diffraction response and the measured diffraction response.

11. The method as claimed in claim 10, wherein the second parameter is correlated with the first parameter, and the first parameter is assumed to have the estimated value during the fitting based reconstruction process.

12. A metrology apparatus comprising:
    an illumination system configured to illuminate with radiation at least a structure produced using a semiconductor manufacturing process on a substrate;

a detection system configured to detect scattered radiation arising from illumination of the structure; and a processor configured to at least:

combine measured values of a first parameter associated with the semiconductor manufacturing process to obtain an estimated value of the first parameter, wherein the first parameter is associated with a first layer formed during the semiconductor manufacturing process; and reconstruct at least a second parameter associated with the characteristic of the structure using the estimated value of the first parameter and a measurement of the structure, wherein the second parameter is associated with a second layer formed during the semiconductor manufacturing process, the second layer being formed subsequent to the first layer.

13. A lithographic cell comprising:

a lithographic apparatus and/or a track apparatus; and the metrology apparatus of claim 12.

14. A non-transitory computer program product comprising processor readable instructions which, when run on a suitable processor-controlled apparatus, cause the processor-controlled apparatus to at least:

combine measured values of a first parameter associated with a semiconductor manufacturing process to obtain an estimated value of the first parameter, wherein the first parameter is associated with a first layer formed during the semiconductor manufacturing process and a parameter model is used to estimate the value for the first parameter, wherein the parameter model describes the variation of at least the first parameter as a function of location on the substrate surface; and reconstruct at least a second parameter associated with a characteristic of a structure formed on a substrate by the semiconductor manufacturing process using the estimated value of the first parameter and a measurement of the structure, wherein the second parameter is associated with a second layer formed during the semiconductor manufacturing process, the second layer being formed subsequent to the first layer.

15. The computer program product of claim 14, wherein the instructions are further configured to cause the processor-controlled apparatus to optimize a sampling scheme which determines one or more measurement locations on the substrate during subsequent measurement of the first layer and/or on the second layer.

16. The computer program product of claim 14, wherein the instructions are further configured to cause the processor-controlled apparatus to determine variance in the measured values and determine an uncertainty value for the estimated value of the first parameter from the determined variance.

17. The computer program product of claim 14, wherein the first parameter comprises one or more selected from: critical dimension, focus, a profile dimension, side wall angle or angle of any structure feature, or overlay.

18. The non-transitory computer program product of claim 14, wherein the second parameter comprises one or more selected from: critical dimension, focus, a profile dimension, side wall angle or angle of any structure feature, or overlay.

19. A metrology apparatus comprising:

an illumination system configured to illuminate with radiation at least a structure produced using a semiconductor manufacturing process on a substrate;

a detection system configured to detect scattered radiation arising from illumination of the structure; and the non-transitory computer program product of claim 14.

20. The metrology apparatus of claim 12, wherein the processor is further configured to use a parameter model to estimate the value for the first parameter, wherein the parameter model describes the variation of at least the first parameter as a function of location on the substrate surface.

* * * * *